United States Patent
Afromowitz (10) Patent No.: US 6,635,412 B2
(45) Date of Patent: Oct. 21, 2003

(54) METHOD FOR FABRICATING 3-D STRUCTURES WITH SMOOTHLY-VARYING TOPOGRAPHIC FEATURES IN PHOTO-SENSITIZED EPOXY RESISTS

(76) Inventor: Martin A. Afromowitz, 4429 Forest Ave. SE., Mercer Island, WA (US) 98040

( * ) Notice: Subject to any disclaimer, the term of this patent is extended or adjusted under 35 U.S.C. 154(b) by 0 days.

(21) Appl. No.: 09/902,829

(22) Filed: Jul. 10, 2001

(65) Prior Publication Data

US 2002/0006588 A1 Jan. 17, 2002

Related U.S. Application Data

(60) Provisional application No. 60/217,397, filed on Jul. 11, 2000.

(51) Int. Cl.[7] .............................. G03F 7/00; G03F 7/36; G03F 7/40
(52) U.S. Cl. ...................... 430/322; 430/329; 430/330; 430/396
(58) Field of Search .............................. 430/322, 329, 430/330, 396

(56) References Cited

U.S. PATENT DOCUMENTS

| | | | | |
|---|---|---|---|---|
| 4,799,993 A | * | 1/1989 | Hagan | 156/644 |
| 4,826,756 A | * | 5/1989 | Orvek | 430/328 |
| 5,124,216 A | * | 6/1992 | Giapis et al. | 430/30 |
| 5,178,975 A | * | 1/1993 | Ng Chiong et al. | 430/5 |
| 5,212,575 A | * | 5/1993 | Kojima et al. | 359/82 |
| 5,310,623 A | | 5/1994 | Gal | 430/321 |
| 5,348,828 A | * | 9/1994 | Murata et al. | 430/20 |
| 5,457,005 A | * | 10/1995 | Babich et al. | 430/296 |
| 5,830,605 A | | 11/1998 | Umeki et al. | 430/5 |
| 5,851,705 A | * | 12/1998 | Lee | 430/5 |
| 6,071,652 A | | 6/2000 | Feldman et al. | 430/5 |

* cited by examiner

Primary Examiner—Mark F. Huff
Assistant Examiner—Nicole Barreca
(74) Attorney, Agent, or Firm—Jensen & Puntigam, P.S.

(57) ABSTRACT

A method utilizing gray-tone exposure of a class of thick negative photo-sensitized epoxy resists from the substrate side of a transparent substrate and development methods that rely upon a physical distinction between polymerized (solid) and unpolymerized (liquid) photoresist at elevated temperatures may be used to fabricate 3-D structures in the photo-sensitized epoxy. Such structures may exhibit smoothly-varying topographic features with thicknesses as great as 2 mm.

19 Claims, 7 Drawing Sheets

METHOD FOR FABRICATING 3-D STRUCTURES WITH SMOOTHLY-VARYING TOPOGRAPHIC FEATURES IN PHOTO-SENSITIZED EPOXY RESISTS

This application claims priority to U.S. Provisional Application Ser. No. 60/217,397, filed on Jul. 11, 2000.

BACKGROUND OF THE INVENTION

1. Field of the Invention

The present invention relates to techniques for processing photoresist materials generally used in the fabrication of microelectronic, micro-optical and micromechanical devices.

2. Description of the Background Art

Various types of microelectronic, micro-optical, and/or micromechanical structures may exhibit overall dimensions ranging between 50 microns ($\mu$m) to a few millimeters (mm). Such structures are useful in creating devices that are purely mechanical (such as watch gears), electro-mechanical (such as electrostatically-driven vibrating elements), optical (such as arrays of lenses), electro-optical (such as movable micro-mirrors), or for use with fluids (such as ink-jet printing heads).

A common method for fabricating such structures utilizes positive photoresist, which is applied in a thin layer to a substrate. Following application to the substrate, the free surface of the positive photoresist is positioned under a mask that is opaque in some regions and transparent in other regions. The positive photoresist is subsequently exposed on its free surface to ultraviolet (UV) light, which is patterned by passage through the mask. Positive photoresist is softened by exposure to UV light, and when the exposed photoresist layer is subsequently developed by rinsing in a developing solution, the UV-exposed and softened regions dissolve in the developer and wash away, leaving the unexposed photoresist in place on the substrate.

Typically, the positive photoresist layer is less than 100 $\mu$m in thickness, and in most cases, the entire thickness of this layer in the UV-exposed regions is removed by the developer, yielding photoresist structures that have nearly vertical side walls. It is typical that the side of the substrate upon which the photoresist resides is then subjected to an etching process that transfers the pattern in the photoresist to the underlying substrate. The substrate is shielded from the etching process in the regions in which photoresist not exposed to the UV light still remains on the substrate. By this sequence of steps, and by repeated application of this sequence of steps, structures with complex shapes may be fashioned in the substrate. One may use this sequence of steps to fabricate micro-structures having minutely stepped surfaces, for example.

If a continuously curved photoresist structure is required, one may expose positive photoresist on its free surface through a mask that permits varying doses of UV light to penetrate the mask and illuminate the photoresist. The mask may be a gray-tone mask, in which different areas contain different UV light transmission fractions; or it may be a mask having very small low UV transmission dots of varying sizes or dot densities, selectively placed in regions of otherwise high UV light transmission. Regions of the positive photoresist exposed to a high enough dose of UV light will soften throughout the thickness of the photoresist, as described above. Regions of photoresist exposed to lesser doses will soften from the exposed free surface to diminished depths, depending on the UV light dose. Upon development, the positive photoresist remaining on the substrate will exhibit variations in thickness, corresponding to the variations in UV dose that the mask allowed to penetrate to the photoresist layer. This pattern of varying thickness of positive photoresist can then be transferred to the substrate by known dry etching techniques.

A major limitation results from the fact that the greatest thickness of positive photoresist that may be processed in the manner described above is generally less than 100 $\mu$m. This is a result of the high absorption of UV light in positive photoresist. If one attempts to expose too thick a layer, the UV light fails to adequately penetrate the deeper-lying volumes of the positive photoresist. As a result, the deeper-lying volumes fail to soften, therefore undesirably preventing full-thickness removal of the resist.

For some applications, however, it is advantageous to fabricate or fashion photoresist structures having thicknesses that are much greater than those attainable using positive photoresist.

A very useful class of photo-sensitized epoxy resists has been developed which has been shown to be useful at resist thicknesses up to 2 mm. An example of this class of resists is SU-8, currently manufactured by MicroChem Corp. of Newton, Mass., and by Sotec Microsystems SA, of Renens, Switzerland. This resist is a negative photoresist; in contrast to the behavior of positive photoresist, SU-8 toughens by polymerization upon proper exposure to UV light (of wavelengths near 365 nm). An attractive feature of this class of materials is its ability to produce structures with almost vertical side walls with thicknesses as great as 2 mm, which is much greater than that of any other photoresist.

All available literature that discusses the processing of this material is directed at teaching the best sequence of steps and parameters of individual process steps to improve the user's ability to fabricate structures in the photoresist having the full height of the film and nearly vertical side walls. Although the material can be spun on a substrate at a variety of initial thicknesses, all structures then fabricated in that layer are generally expected to have essentially the same thickness as that of the initial film.

In order to achieve structures in the photoresist having varying thicknesses, a step approximation to smoothly curved surfaces can be fabricated using a technique in which several layers of the photoresist are applied in succession, each one being processed individually. This technique can be used for fabricating a final structure containing steps, each step corresponding to the thickness of one of the several layers making up the final structure. In this technique, again, one finds that the steps are nearly vertical.

A well-accepted sequence of process steps for fabricating structures having the full height of the photoresist film with nearly-vertical side walls in a layer of SU-8 is as follows:

1. Clean the substrate and apply an adhesion-promoter like hexamethyldisilazane (HMDS).

Subsequent steps are done in a room in which green, blue and UV light are excluded (orange room), since SU-8 is sensitive to short wavelength visible and near ultraviolet light.

2. Spin-on a desired thickness of SU-8. The starting material is a viscous liquid mixture of SU-8 resin (typically bisphenol A novolac glycidyl ether), a solvent for SU-8 such as γ-Butyrolactone (GBL) or propylene glycol methyl ether acetate (PGMEA), and a photo-acid generator such as a triaryl sulfonium salt (e.g. Cyracure UVI, Union Carbide Corp.). Varying the ratio of resin to solvent yields mixtures with different viscosities at room temperature. One selects the mixture that will permit spinning the layer of desired thickness at spin speeds between approximately 500 and 5000 rpm.

3. The substrate with its spun-on layer is permitted to rest on a level surface so that the viscous SU-8 layer can flatten, and then the substrate is placed on a hotplate with final temperatures in the neighborhood of 95° C. (softbake). The step causes evaporation of the solvent from the layer. As the solvent evaporates, the SU-8 layer that remains on the substrate becomes more viscous. However, it remains a liquid at 95° C. since even pure SU-8 has a glass transition temperature of approximately 55° C.

4. When the solvent has evaporated from the spun-on layer, the substrate is removed from the hotplate and cooled to room temperature. At room temperature, the SU-8 layer is a solid.

5. The SU-8 layer is exposed with light whose wavelengths are between 300 and 400 nm. The light is patterned on the SU-8 layer by the use of a mask which has areas that are opaque to the exposing illumination as well as areas that are transparent. This process is typically carried out in a mask aligner, and the mask may be first positioned to align with structures already on the substrate. In this step, the exposure is made from the SU-8 side of the substrate. The areas of the SU-8 that are exposed to this light release photo-acid from the photo-acid generator which causes the SU-8 resin to cross-link. An important consideration in selecting the energy per area (dose) of the exposure is to assure that the entire film thickness of exposed areas will polymerize completely.

6. The substrate with its exposed SU-8 layer is placed on a hotplate, with final temperatures of at least 95° C. This step greatly accelerates the cross-linking of the SU-8 material in the areas exposed to the UV light. In the ideal case, the entire thickness of SU-8 material in exposed areas will become fully polymerized. The material in the unexposed areas remains unpolymerized.

7. The patterned SU-8 layer is developed. The standard method involves placing the substrate with its exposed SU-8 film in a bath or in a sequence of baths containing a solvent for unpolymerized SU-8. In these baths, the unexposed and unpolymerized areas of the SU-8 film are dissolved away and ideally only the polymerized areas remain attached to the substrate.

8. The substrate with its developed fully-polymerized SU-8 structures is then rinsed and dried.

Methods for creating structures with smoothly-varying thicknesses in this class of materials do not exist. If processes designed for creating continuously curved surfaces in positive photoresist were applied to this material, such as by exposing the SU-8 on its free surface through a mask that permits varying doses of UV light to penetrate the mask and expose the photoresist, the SU-8 would polymerize first near the free surface if the dose there were sufficient. At greater depths into the photoresist film, the SU-8 might not polymerize. With development, the unpolymerized volumes of SU-8 near the photoresist-substrate interface would dissolve, and the entire SU-8 film would undesirably lift off the substrate.

What is needed is a method for fabricating structures in this and related classes of materials, where such structures may be characterized by thicknesses that vary smoothly with position. The method should minimize the number of masking and other processing sequences required to fabricate such structures using a film of suitable initial thickness.

SUMMARY OF THE INVENTION

The present invention comprises a new process by which 3-D structures with smoothly-varying topographic features and continuously-varying thickness can be fabricated using one layer of photo-sensitized epoxy resist and one exposure and development process sequence. The structures are formed in a layer of photo-sensitized epoxy resist having an initial selected thickness residing on a substrate, by exposing said layer, comprising a material such as SU-8, to doses of UV light which impinge on said layer from the substrate side, said doses varying across the width and breadth of the surface of said substrate.

In one embodiment, the substrate is transparent or essentially transparent to said light. Thus, appropriate substrates include most glasses, fused silica, and a variety of polymers. As said light propagates through said layer, the intensity of said light decreases monotonically due to the absorption of said light by chemical components of said layer. We utilize a known property of photo-sensitized epoxy resists that requires that a minimum exposure dose, which is defined as the product of the intensity of said light times the duration of the exposure, is necessary to polymerize said photo-sensitized epoxy resist. Due to said decrease in said light intensity, the exposure dose also decreases monotonically in the direction of exposure light propagation within said layer. Thus, by suitable selection of impinging UV light intensity and exposure duration, one may cause a portion of said layer to polymerize, wherein said polymerized portion has thickness less than or equal to said initial thickness, and resides adjacent to the substrate. By varying the intensity of said impinging exposing light across the width and breadth of the surface of said substrate, the thickness of the polymerized portion of the layer can be made to vary from zero thickness up to the initial thickness of the layer.

The unpolymerized portion of the layer can be removed from the substrate by heating the layer to a temperature in excess of the glass transition temperature of said unpolymerized portion, at which temperature the polymerized portion is a solid and the unpolymerized portion is a liquid, and causing the unpolymerized portion to flow off the substrate.

DETAILED DESCRIPTION

The present invention comprises a new process by which 3-D structures with smoothly-varying topographic features and continuously-varying thickness can be fabricated using one layer of SU-8, one mask, and one exposure and development process sequence. In one embodiment, the substrate is transparent or essentially transparent to the light needed for exposure of the SU-8. Thus, appropriate substrates include most glasses, quartz, and a variety of polymers.

Process Sequence

The following processing steps may be performed in accordance with one embodiment of the invention:

1. Clean a substrate and apply an adhesion-promoter, if desired and/or necessary.

Subsequent steps may be performed in an orange room.

2. Spin-on or otherwise apply a layer of SU-8 at least as thick as the thickest structure desired. For some applications, the thickness of the applied SU-8 layer may be 10%–20% thicker than the thickness of the thickest structure desired (or possibly even thicker). In other applications, the thickness of the applied SU-8 layer may exactly or essentially exactly match that of the thickest structure desired.

3. Level the spun-on film at room temperature, and/or softbake the film in a manner analogous to that previously described.

4. Remove the substrate from the hotplate and allow it to cool to room temperature.

5. Expose the SU-8 layer from the substrate side using light characterized by wavelengths between 300 and 400 nm (i.e., light characterized by a wavelength, wavelength range, or spectral content that may result in appropriate polymerization or cross-linking within the SU-8 layer). The light may be patterned by the use of a gray-tone mask, which may include areas of varying opacity relative to the exposing illumination, in a manner readily understood by those skilled in the art. A gray-tone mask may be designed and/or fabricated, for example, in the manner described in U.S. Pat. No. 5,310,623, entitled "Method for Fabricating Microlenses," by Gal. Exposure may be carried out on a mask aligner, and the mask may be first positioned to align with structures already on the substrate.

Figure 1:
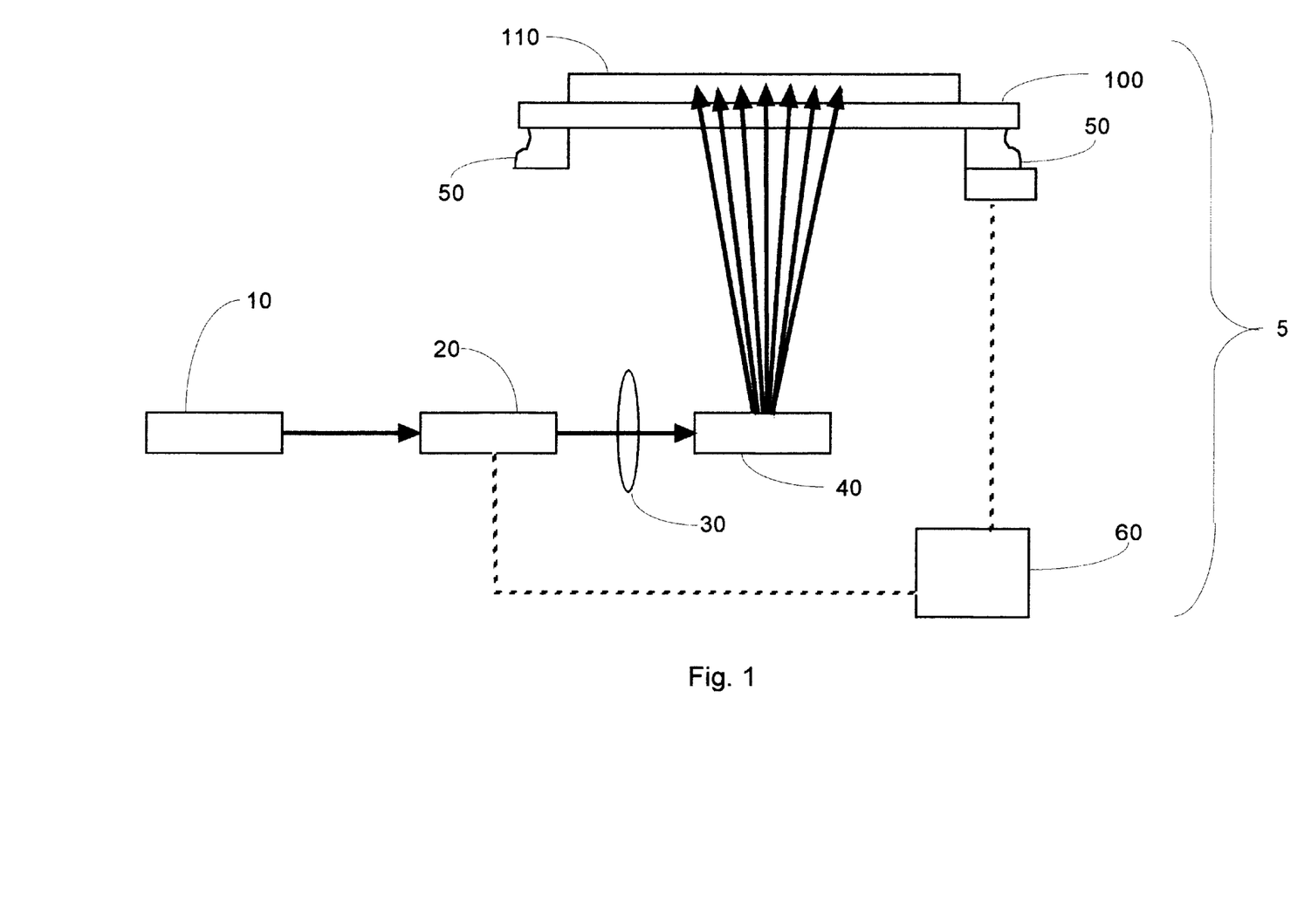
FIG. 1 is a block diagram of a scanning laser exposure system that may be used to selectively expose regions within a photo-sensitized epoxy layer in accordance with the present invention.

Other methods for exposing areas of the SU-8 layer with different doses of exposing illumination, such as via a laser scanning device, are also possible. FIG. 1 is a block diagram of a scanning laser exposure system 5 that may be used to selectively expose regions within a photo-sensitized epoxy layer 110 such as SU-8 in accordance with the present invention. The scanning laser exposure system 5 may comprise a laser 10, a modulator 20, a focusing element 30, a deflection apparatus 40, a substrate carrier 50, and a control computer 60. The substrate carrier 50 holds a substrate 100 upon which the photo-sensitized epoxy layer 110 resides.

The laser 10 generates light having a spectral content capable of causing the polymerization of the photo-sensitized epoxy layer 110. The intensity of the laser light may be modulated 20 under computer control, passed through a focusing lens which may focus the light within the photo-sensitized epoxy layer 110 and then to the deflection apparatus 40. The deflection apparatus 40 may comprise a moving mirror, which reflects laser light through the substrate 100 and into the photo-sensitized epoxy layer 110 under the direction of the computer 60. The deflection apparatus 40 may be designed to deflect or reflect modulated and focused laser light onto a given plane transverse to the plane of the substrate within the photo-sensitized epoxy layer 110. In such a situation, the substrate carrier 50 may adjust the position of the substrate 100 and the photo-sensitized epoxy layer 110 along any direction to effectuate particular exposures and exposure patterns. The substrate carrier 50 may perform position adjustment in response to signals received from the computer 60.

Regardless of the particular type of exposure system employed, the areas of the SU-8 that are exposed to a greater light dose will cross-link from the substrate interface up through a greater film thickness than areas that are exposed to a lesser dose. An important consideration in designing the gray-tone mask, or any other variable-exposure means for controlling the local dose of the exposure, is a measured characteristic of the SU-8 that describes how the thickness of SU-8 that will polymerize as a function of exposure dose for the light used to expose the film.

6. Place the substrate with its exposed SU-8 layer on a hotplate, with final temperatures of at least 95° C. This step greatly accelerates the cross-linking of the SU-8 material in the areas exposed to the UV light. However, since the SU-8 has a known absorption length for the light used in the exposure step, regions of the exposed film nearest the substrate will receive higher doses than regions further from the substrate. For each formulation of SU-8, there exists a minimum exposure dose that is required to effect sufficient cross-linking such that the material so exposed will be a solid at 95° C. Regions of the SU-8 film which do not receive this minimum exposure dose will remain unpolymerized, and therefore liquid, at 95° C.

7. Develop the patterned SU-8 layer. Although solvent development techniques similar to the process described above may be effective is removing the unexposed SU-8 photoresist, such solvent development techniques tend to leave the surface of the remaining polymerized SU-8 film rough (with surface roughness of as much as 2 $\mu$m rms). The remaining polymerized SU-8 structures also tend to absorb solvent and swell, thus distorting their size and shape. The swelling can undesirably increase the volume of polymerized structures by 30% or more, and can leave them permanently deformed, even after the solvent has been fully removed from the remaining polymerized structures. The solvent swelling can also cause SU-8 structures to lift off the substrate due of the strain at the interface between the substrate and the swelled SU-8.

Solvent swelling may be a challenge in this process because the polymerized SU-8 is weakly cross-linked. It is polymerized just sufficiently to be solid at 95° C. Typically, SU-8 manufacturers recommend much higher doses of UV light to fully polymerize the SU-8 layers. The polymerized SU-8 that results from exposure to higher doses of UV light are so completely cross-linked that solvent development does not cause significant solvent swelling.

In the context of the present invention, a more suitable development procedure may comprise a technique referred to herein as hot-flow development. Hot flow development relies upon a physical distinction between polymerized (solid) and unpolymerized (liquid) photo-sensitized epoxy at a given temperature. For SU-8, this temperature may be 95°

C. A first variant of hot flow development is hot-spin development. In hot spin development, the substrate (upon which the exposed SU-8 layer or film resides) is placed on a spinner and heated to 95° C. The heating may be performed, for example, via a heated spinner chuck, blowing heated air onto the SU-8 film on the substrate while it is mounted on the spinner, and/or irradiation with infrared light or some other effective means.

When the SU-8 film reaches 95° C., the exposed and polymerized regions of the film will be solid, but the regions of the film that have not been exposed to the minimum exposure dose required for polymerization remain liquid. In many regions of the film, liquid unpolymerized SU-8 may be lying above solid polymerized material. The heated wafer may be spun at rates as high as 7000 rpm. As a result, the liquid unpolymerized SU-8 may be spun off the wafer by the centripetal forces, leaving only a thin layer of liquid unpolymerized material still adhering to the substrate and/or to the underlying solid polymerized material. The thickness of this thin adherent layer depends upon film viscosity and surface tension forces at 95° C., but may be minimized by using higher rotational rates and longer spin times. The thickness of this film of adherent unpolymerized SU-8 can be reduced to a few microns, although it tends to adhere in thicker volumes at concave corners in the polymerized SU-8 structures.

At this point, a second variant of the hot-flow development procedure may be employed. In this variant, the unexposed SU-8 still adherent to the substrate and to the polymerized SU-8 structures may be further removed by blowing heated gas at high velocity at the liquid unpolymerized SU-8 using a fine nozzle which creates a jet of heated gas. In one embodiment, the liquid SU-8 may be propelled out of the concave corners of the structures using this technique with a practiced hand while observing the process under a low-power stereo microscope. Alternatively, a motorized chuck upon which the substrate is held may be manually, semi-automatically, or automatically positioned beneath such a nozzle, where such positioning may be aided by a microscope or vision system, to facilitate liquid SU-8 removal.

In general, hot-flow development techniques or methods rely upon inherent differences in viscosity between polymerized and unpolymerized SU-8 at or above 95° C. Those skilled in the art will understand that the present invention may additionally or alternatively employ multiple variations of the hot-flow development method described above. SU-8 films developed by hot-flow techniques or methods may exhibit surface roughness typically less than 200 nm rms, and do not suffer from solvent swelling and/or delamination from the substrate that results from the excessive strain produced by such swelling.

8. The heated substrate with its polymerized SU-8 3-D structures with smoothly-varying topographic features is permitted to cool.

Figure 2A:
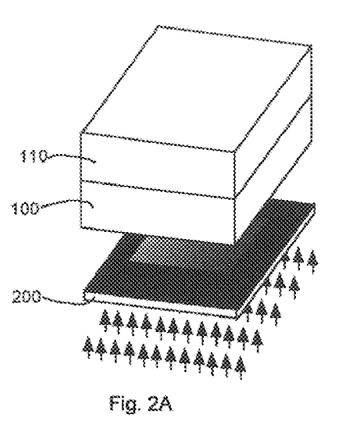
FIG. 2A is a perspective illustration of a substrate upon which a photo-sensitized epoxy resist layer resides, and an exemplary exposure thereof in accordance with an embodiment of the invention.

FIG. 2A is a perspective illustration of a substrate 100 upon which a photo-sensitized epoxy resist layer 110 resides, and an exemplary exposure thereof in accordance with an embodiment of the invention. In FIG. 2A, the resist layer 110 receives a given exposure dose at an appropriate wavelength of light through an exemplary gray-tone mask 200 and the substrate 100. As indicated above, the substrate 100 may be transparent or essentially transparent to the exposing light.

Figure 2B:
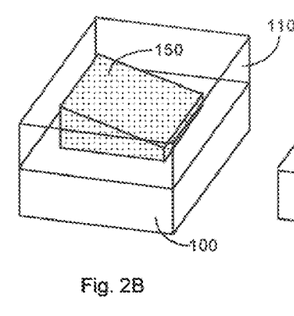
FIG. 2B is a perspective illustration of an exemplary latent image within the photo-sensitized epoxy resist layer of FIG. 2A.

During exposure, portions of the photo-sensitized epoxy resist layer 110 may be cross-linked to varying degrees, in accordance with light attenuation and/or patterning selectively performed via the gray-tone mask 200. FIG. 2B is a perspective illustration of an exemplary latent image 150 within the photo-sensitized epoxy resist layer 110 of FIG. 2A. The latent image 150 corresponds to regions within the resist 110 that have been exposed to at least a minimum dose necessary to cause sufficient polymerization so that the volume of this latent image would be solid at 95° C., and is surrounded by unpolymerized regions within the resist layer 110, in a manner readily understood by those skilled in the art.

Figure 2C:
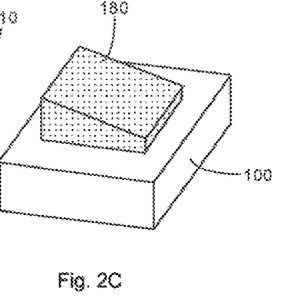
FIG. 2C is a perspective illustration of an exemplary smoothly varying three-dimensional resist profile created in accordance with an embodiment of the invention.

During development, unpolymerized material may be removed in manners described above, leaving polymerized material upon the substrate 100. FIG. 2C is a perspective illustration of an exemplary smoothly varying 3-D epoxy resist profile 180 remaining upon the substrate 100 after development, created in accordance with an embodiment of the invention.

Figure 3A:
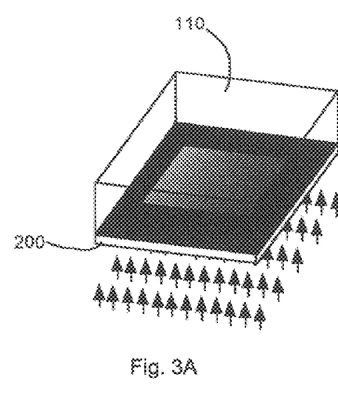
FIG. 3A is a perspective illustration of a gray-tone mask upon which a photo-sensitized epoxy resist layer resides, and an exemplary exposure thereof in accordance with an embodiment of the invention.

In an alternate embodiment, a gray-tone mask 200 may serve as a substrate or carrier upon which a layer 110 of photo-sensitized epoxy resist directly resides. That is, a separate substrate 100 of the type shown in FIGS. 2A through 2C may not be required. FIG. 3A is a perspective illustration of a gray-tone mask 200 upon which a photo-sensitized epoxy resist layer 110 resides, and an exemplary exposure thereof in accordance with an embodiment of the invention. Relative to FIG. 2A, like reference numbers indicate like elements to aid understanding.

Figures 3B, 3C:
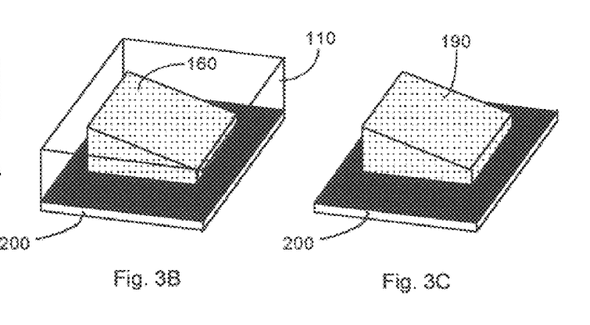
FIG. 3B is a perspective illustration of an exemplary latent image within the photo-sensitized epoxy resist layer of FIG. 3A.
FIGS. 3C is a perspective illustration of an exemplary smoothly varying three-dimensional resist profile created in accordance with another embodiment of the invention.

FIG. 3B is a perspective illustration of an exemplary latent image 160 within the photo-sensitized epoxy resist layer 110 of FIG. 3A. The latent image 160 comprises regions within the resist layer 110 that have been selectively exposed to at least a minimum dose necessary to cause sufficient polymerization so that the volume of this latent image would be solid at 95° C., in accordance with light transmission through the gray-tone mask 200. Other regions within the resist layer 110 remain unpolymerized.

As above, development results in removal of unpolymerized material from the resist layer 110. FIG. 3C is a perspective illustration of an exemplary smoothly varying three-dimensional resist profile 190 remaining after development, created in accordance with another embodiment of the invention.

Modern exposure tools typically include a chuck or platform upon which a wafer or substrate may reside. A mask carrier typically resides above the chuck, and a light source is situated above the mask carrier. In such a conventional exposure arrangement, light travels from the light source, through a mask, through a resist layer, and to a substrate. In contrast, in the present invention, light may travel from a light source, through a mask, optionally through a substrate, and into or through a photo-sensitized epoxy layer 110.

Figure 3D:
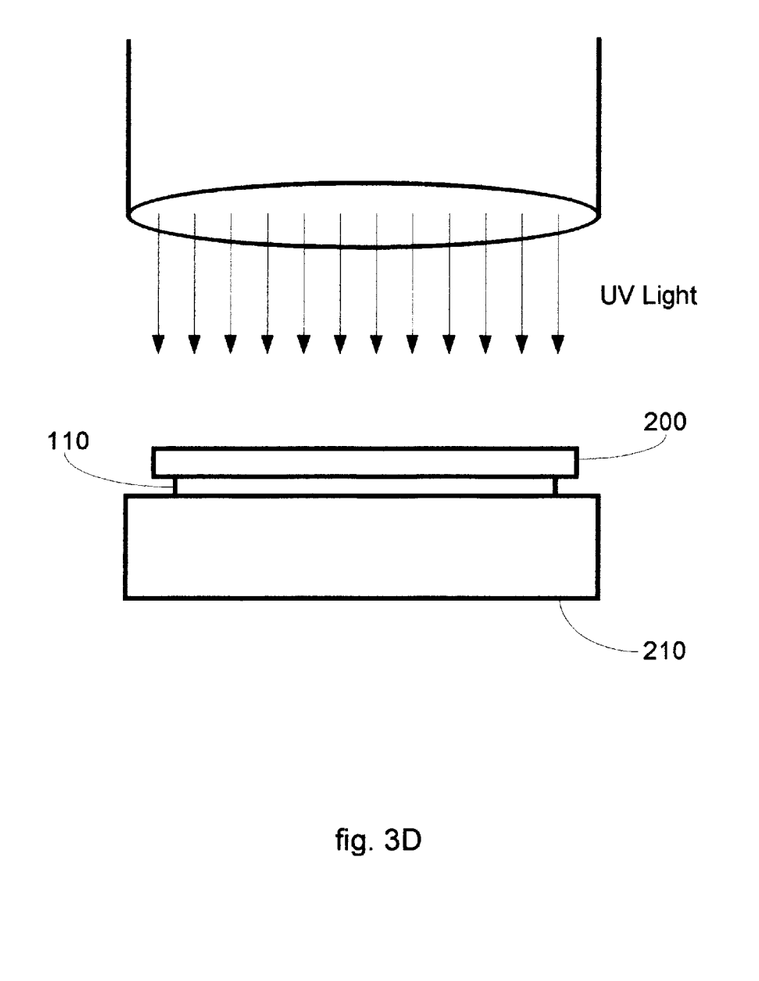
FIG. 3D is a perspective illustration of a gray-tone mask having a photo-sensitized epoxy layer thereupon, and positioned for exposure in accordance with a conventional exposure tool.

In one embodiment, the photo-sensitized epoxy layer 110 may itself be positioned upon a chuck or platform, thereby facilitating exposure via a conventional exposure tool. FIG. 3D is a perspective illustration of a gray-tone mask 200 having a photo-sensitized epoxy layer 110 thereupon, and positioned for exposure upon a wafer chuck 210 in accordance with a conventional exposure tool. In such an exposure situation, the photo-sensitized epoxy layer 110 may contact the wafer chuck 210. To minimize or eliminate undesirable surface damage and/or contamination, the photo-sensitized epoxy layer 110 may exhibit a thickness that is greater than that of the thickest 3-D structure to remain following development. Surface defects may be removed during development if polymerized resist does not extend throughout the entire thickness of the photo-sensitized epoxy layer 110.

In an alternate embodiment, in the event that a mask carrier (not shown) is present, a gray-tone mask 200 having a photo-sensitized epoxy layer 110 thereupon may be positioned upon the mask carrier, and held in place via a vacuum or other conventional technique. A wafer chuck 210 may be lowered or positioned such that it does not contact the photo-sensitized epoxy layer 110, thereby preventing the occurrence of such resist surface layer defects.

Process Design Considerations

Figure 4:
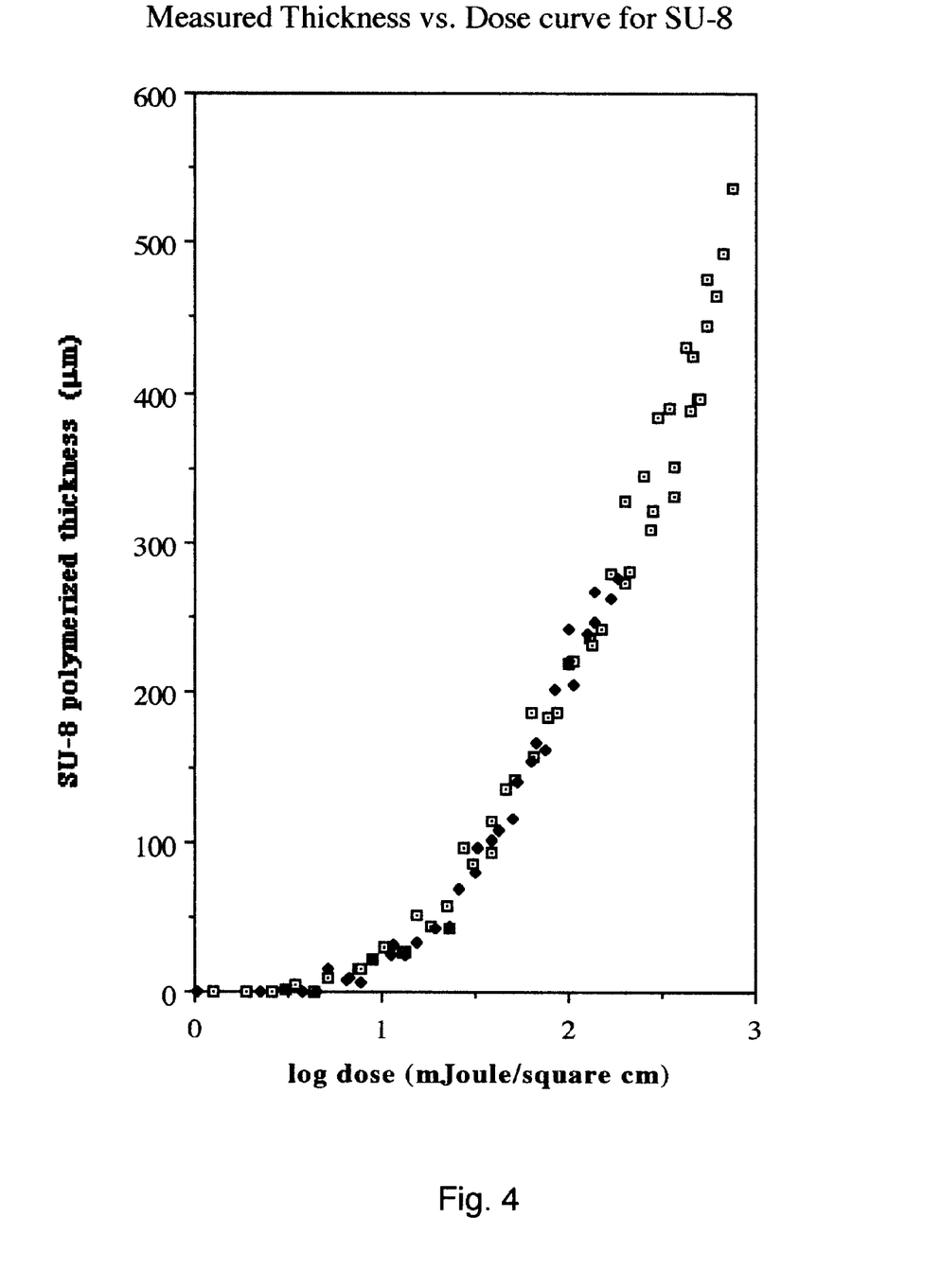
FIG. 4 is an exemplary semilog graph of polymerized SU-8 layer thickness versus exposure dose.

In order to design the gray-tone mask or other variable-exposure means, one must first know a resist characteristic that describes the thickness of SU-8 that will polymerize as a function of exposure dose for the specific light source used to expose the film. FIG. 4 is a graph showing a typical measured thickness versus dose characteristic for a conventional UV arc-lamp source, such as the UV source associated with a Canon PLA 501F contact mask aligner.

For a desired thickness of polymerized SU-8 at a chosen position on or within a layer, one may design the optical density of the gray-tone mask in conjunction with the known intensity of the illuminating lamp and the known associated thickness versus dose characteristic, or otherwise expose the SU-8 layer such that the chosen area of the SU-8 film receives a light dose that will produce polymerization to a desired thickness. By way of example, using a Canon PLA 501F contact mask aligner, which may have a measured exposing light intensity of 5.25 mW/cm^2 in a wavelength band at 365 nm, an exposure time of approximately 170 seconds may be required to polymerize a 500 micron thickness of SU-8, when said exposing light first passes through a region of a gray-tone mask having a transmissivity of approximately 70%. Extending this concept to an entire wafer leads to the design of gray-tone masks or variable-intensity light scanning schemes. Manipulation of the spectral distribution of the light source may also be accomplished (using filters in the case of an arc-lamp light source in a mask aligner, or by choosing an appropriate laser source for a light scanning system) in order to adjust the thickness vs. dose characteristic of the SU-8 for particular applications.

Figure 5:
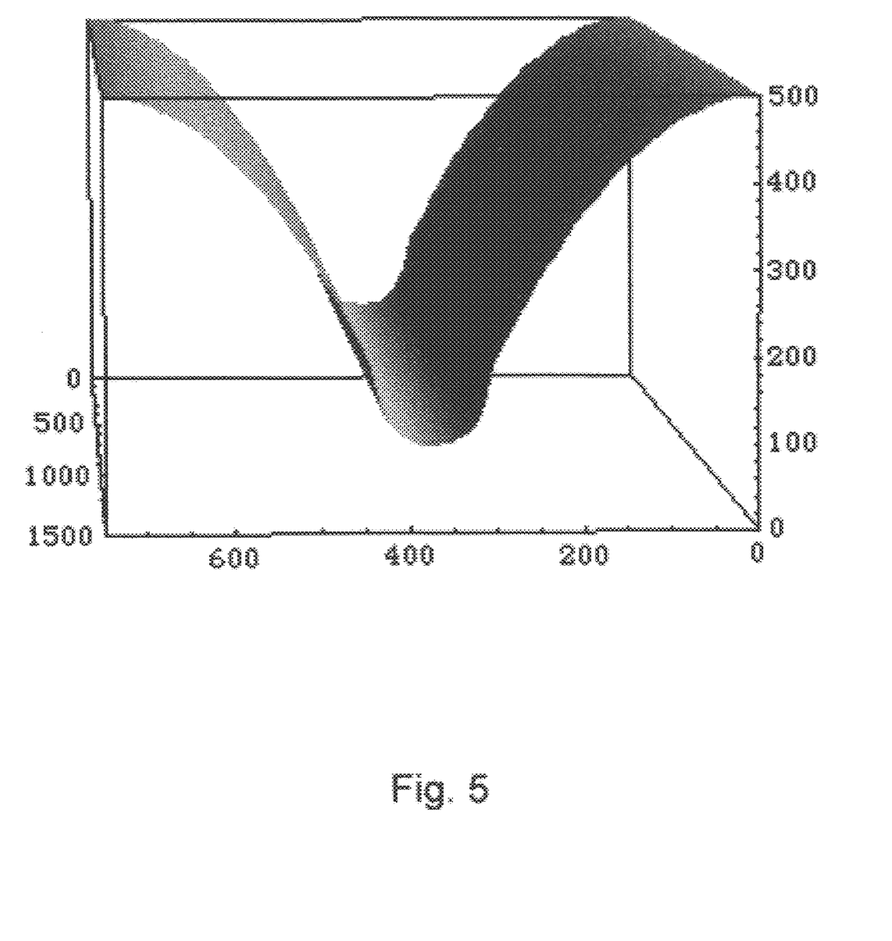
FIG. 5 is a perspective view of a fiber positioning structure designed and/or fabricated in accordance with the present invention.

FIG. 5 is a perspective view of an exemplary fiber positioning structure 300 designed and/or fabricated in accordance with the present invention. The fiber positioning structure 300 may comprise a polymerized SU-8 layer characterized by a curved V-groove having parabolically-shaped walls, and which is 750 $\mu$m wide at the top, narrowing to a 125 $\mu$m wide cylindrical slot at the bottom. The fiber positioning structure 300 is 1.5 mm long. The fiber positioning structure 300 facilitates placement or positioning of the center of a 125 $\mu$m fiber at a distance of 200 $\mu$m above a substrate surface.

Figure 6:
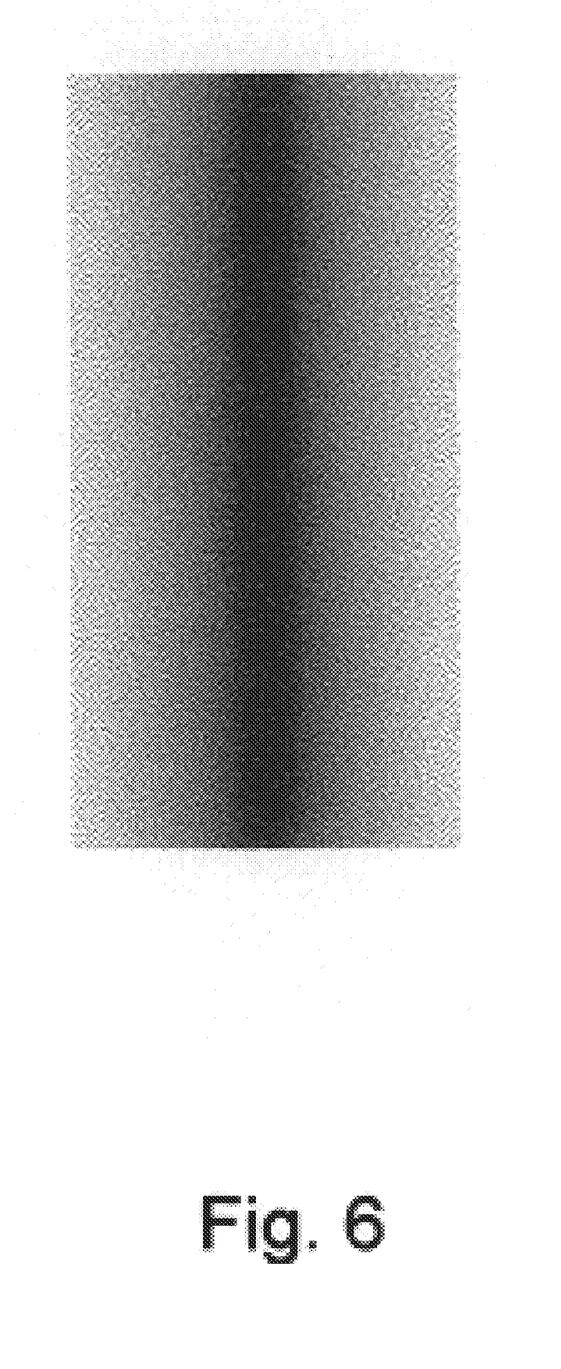
FIG. 6 is a gray-tone image of a gray-tone mask that may be used to produce the optical fiber positioning structure of FIG. 5.

FIG. 6 is a gray-tone image of a gray-tone mask 400 designed for producing the fiber positioning structure 300 of FIG. 5. Exposure of an SU-8 layer using the gray-tone mask 400 and a uniform dose of, for example, 900 mJoules/cm$^2$ may selectively polymerize appropriate regions within the SU-8 layer. Subsequent processing of the SU-8 layer in accordance with process steps detailed above may produce the fiber positioning structure 300.

Darker regions within the gray-tone mask 400, having reduced UV transmission, cause a reduced dose to illuminate corresponding regions of the SU-8 layer. These regions may polymerize to a reduced distance relative to the substrate/photoresist interface. Lighter gray-tone mask regions, on the contrary, permit an increased dose to illuminate corresponding regions of the SU-8 photoresist. These regions may polymerize to an increased distance relative to the substrate/photoresist interface.

What is claimed is:

1. A method for forming a three-dimensional structure in a photo-sensitized epoxy layer residing upon a substrate, the substrate having a first side and a second side, the method comprising the steps of:

applying a layer of photo-sensitized epoxy to the first side of the substrate;

exposing at least one region within the layer of photo-sensitized epoxy with a dose of light incident upon the second side of the substrate in a controlled manner to produce polymerization of the selected region, the region being of varying thickness, such that upon removal of non-polymerized regions of the layer, following polymerization of the said region, the resulting three-dimensional structure of polymerized epoxy has a varying topography and varying thickness.

2. The method of claim 1, wherein the three dimensional structure has a target thickness, and the applied layer exhibits a thickness at least as great as the target thickness.

3. The method of claim 1, wherein the light is characterized by a spectral content capable of initiating polymerization within the photo-sensitized epoxy layer.

4. The method of claim 1, wherein the substrate is essentially transparent relative to a portion of the spectral content of the incident light.

5. The method of claim 1, wherein the light is generated by an ultraviolet lamp.

6. The method of claim 1, wherein the light is generated by a laser scanning device.

7. The method of claim 1, wherein the substrate comprises a photomask.

8. The method of claim 1, wherein the substrate comprises a photomask, and wherein the photomask comprises a gray-tone photomask.

9. The method of claim 1, further comprising the step of positioning a photomask between the incident light and the substrate.

10. The method of claim 1, further comprising the step of positioning a gray-tone photomask between the incident light and the substrate.

11. The method of claim 1, further comprising the step of placing the substrate on a hotplate to accelerate polymerization within the layer.

12. The method of claim 1, further comprising the step of developing the layer.

13. The method of claim 1, further comprising the steps of:

heating the layer to a temperature at which polymerized portions of the layer exhibit properties corresponding to a solid, and unpolymerized portions of the layer exhibit properties corresponding to a liquid; and spinning the substrate to remove unpolymerized portions of the layer.

14. The method of claim 1, further comprising the steps of:

heating the layer to a temperature at which polymerized portions of the layer exhibit properties corresponding to a solid, and unpolymerized portions of the layer exhibit properties corresponding to a liquid; and removing unpolymerized portions of the layer with a pressurized gas.

15. A method of claim 1, wherein the polymerized regions have a continuously varying thickness and the three-dimensional structure has a smoothly varying topography, from edge to edge of the polymerized regions.

16. A method for developing a selectively polymerized photo-sensitized layer that resides upon a substrate, comprising the steps of:

heating the layer to a temperature at which polymerized portions of the layer exhibit properties corresponding to a solid, and unpolymerized portions of the layer exhibit properties corresponding to a liquid, without the use of a solvent; and spinning the substrate to remove unpolymerized portions of the layer.

17. The method of claim 16, wherein the layer comprises a photo-sensitized epoxy.

18. A method for developing a selectively polymerized photo-sensitized layer that resides upon a substrate, comprising the steps of:

heating the layer to a temperature at which polymerized portions of the layer exhibit properties corresponding to a solid, and unpolymerized portions of the layer exhibit properties corresponding to a liquid; and removing unpolymerized portions of the layer by blowing heated gas at the unpolymerized portions.

19. The method of claim 18, wherein the layer comprises a photo-sensitized epoxy.

* * * * *